United States Patent
Allen et al.

(10) Patent No.: US 9,287,085 B2
(45) Date of Patent: Mar. 15, 2016

(54) PROCESSING APPARATUS AND METHOD OF TREATING A SUBSTRATE

(71) Applicant: Varian Semiconductor Equipment Associates, Inc., Gloucester, MA (US)

(72) Inventors: Ernest E. Allen, Rockport, MA (US); Jon Ballou, Beverly, MA (US); Kevin M. Daniels, Lynnfield, MA (US); James P. Buonodono, Amesbury, MA (US); Joseph P. Dzengeleski, Newton, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 156 days.

(21) Appl. No.: 14/275,763

(22) Filed: May 12, 2014

(65) Prior Publication Data

US 2015/0325405 A1 Nov. 12, 2015

(51) Int. Cl.
*H01J 37/08* (2006.01)
*H01J 37/20* (2006.01)
*G21K 5/08* (2006.01)
*H01J 37/304* (2006.01)
*H01J 37/305* (2006.01)
*H01J 37/317* (2006.01)

(52) U.S. Cl.
CPC . *H01J 37/20* (2013.01); *G21K 5/08* (2013.01); *H01J 37/304* (2013.01); *H01J 37/3053* (2013.01); *H01J 37/3171* (2013.01)

(58) Field of Classification Search
None
See application file for complete search history.

(56) References Cited

U.S. PATENT DOCUMENTS

| | | | | |
|---|---|---|---|---|
| 4,657,774 | A * | 4/1987 | Satou et al. | 427/527 |
| 5,282,921 | A * | 2/1994 | Poultney | 438/8 |
| 6,172,372 | B1 * | 1/2001 | Vanderpot | 250/492.21 |
| 6,300,628 | B1 * | 10/2001 | Fujii et al. | 850/43 |
| 2002/0096650 | A1 * | 7/2002 | Tsukihara et al. | 250/492.1 |
| 2003/0082891 | A1 * | 5/2003 | Walther | 438/513 |
| 2003/0160190 | A1 * | 8/2003 | Kawaguchi | 250/492.21 |
| 2012/0304454 | A1 * | 12/2012 | Jiang et al. | 29/603.18 |
| 2015/0104885 | A1 * | 4/2015 | Chang | 438/5 |

* cited by examiner

*Primary Examiner* — Michael Logie (57) ABSTRACT

A processing apparatus including a process chamber, a plasma source disposed within the process chamber, wherein the plasma source is movable in a first direction and is configured to emit an ion beam along a second direction that is orthogonal to the first direction. The apparatus may further include a platen disposed within the process chamber for supporting a substrate, and an ion beam current sensor that is disposed adjacent to the platen.

17 Claims, 6 Drawing Sheets

PROCESSING APPARATUS AND METHOD OF TREATING A SUBSTRATE

FIELD OF THE DISCLOSURE

Embodiments of the present disclosure relate generally to device processing, and more particularly to a processing apparatus having a moveable plasma source for implanting ions into a stationary substrate.

BACKGROUND OF THE DISCLOSURE

Processing of substrates using ions finds several applications including ion beam etching and ion implantation. Ion implantation is a standard technique for introducing property-altering impurities into substrates. During a typical ion implantation process, a desired impurity material is ionized in an ion source, the ions are accelerated to form an ion beam of prescribed energy, and the ion beam is directed at the surface of a substrate. The energetic ions in the ion beam penetrate into the sub-surface of the substrate material and are embedded into the crystalline lattice of the substrate material to form a region of desired conductivity or material property.

A processing apparatus that uses ions to treat a substrate may extract ions from a plasma to perform etching, ion implantation or other process. This may generate an ion beam having a roughly circular or elliptical cross sectional shape, an elongated ribbon shape, or other shape that is smaller than the surface of a substrate to be treated. In order to direct ions over substantially the entire surface of the substrate, the substrate may be mechanically driven or "scanned" in a direction that is orthogonal to the direction of an ion beam projected thereon. For example, if an ion beam is projected along a horizontal plane toward a vertically-oriented substrate, the substrate may be scanned in a vertical direction and/or in a lateral direction that is perpendicular to the projected ion beam. The entire surface of the substrate may thereby be exposed to the relatively smaller ion beam during an implantation process.

It is generally desirable to minimize the physical size of a processing apparatus in order to efficiently utilize space within a manufacturing environment. However, this preference for smaller processing apparatus may be balanced against a need for increasing size of substrates such as semiconductor substrates, as well as the requirement that a process chamber of a processing apparatus is generally at least twice as large in one dimension as a substrate to be treated so that the entire surface of the substrate can be scanned across a projected ion beam.

It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In general, various embodiments of the present disclosure provide a processing apparatus including an a process chamber, a plasma source disposed within the process chamber, wherein the plasma source is movable in a first direction and is configured to emit an ion beam along a second direction that is orthogonal to the first direction. The processing apparatus may further include a platen disposed within the process chamber for supporting a substrate, and an ion beam current sensor that is disposed adjacent to the platen.

An exemplary method for processing a substrate using an ion beam in accordance with various embodiments of the present disclosure may include scanning the plasma source in a first direction; emitting the ion beam from a plasma source toward the substrate along a second direction that is orthogonal to the first direction; measuring a beam current of the ion beam; and controlling a processing parameter based on the measured beam current.

In another embodiment, an apparatus to treat a substrate with an ion beam may include a process chamber, a plasma source disposed within the process chamber, the plasma source being movable in a first direction and configured to emit the ion beam along a second direction orthogonal to the first direction, and a platen disposed within the process chamber for supporting a substrate. The apparatus may also include a drive mechanism connected to the platen and configured to move the platen between an upwardly-facing, horizontally oriented transfer position and a vertically oriented processing position, and an ion beam current sensor disposed adjacent to the platen.

BRIEF DESCRIPTION OF THE DRAWINGS

By way of example, various embodiments of the disclosed device will now be described, with reference to the accompanying drawings, in which.

DETAILED DESCRIPTION

Embodiments of an apparatus and method in accordance with the present disclosure are described herein in connection with the processing of workpieces (substrates). In various embodiments, the apparatus and method can be used for, among other processes, the etching or implantation of, for example, solar cell substrates, semiconductor substrates, bit-patterned media, solid-state batteries, polymer materials, flat panels, oxide substrates, and substrates comprising insulator material. Thus, it will be appreciated by those of ordinary skill in the art that the apparatus and method of the present disclosure are not limited to the specific embodiments described below. In various embodiments, a processing apparatus is provided that can be advantageously implemented in a smaller form factor than traditional processing apparatus while allowing the entire surface of a substrate to be exposed to an ion beam. In different embodiments, processing apparatus are provided that hold a substrate in either a horizontal or vertical orientation while the ion beam is scanned with respect to the substrate. As detailed below, this is accomplished by scanning a plasma source that emits the ion beam. The use of a scanning plasma source and stationary substrate facilitates the ability to expose an entire substrate to an ion beam in an apparatus whose dimensions are smaller than a conventional apparatus that may scan a substrate with respect to a stationary plasma source.

Figure 1:
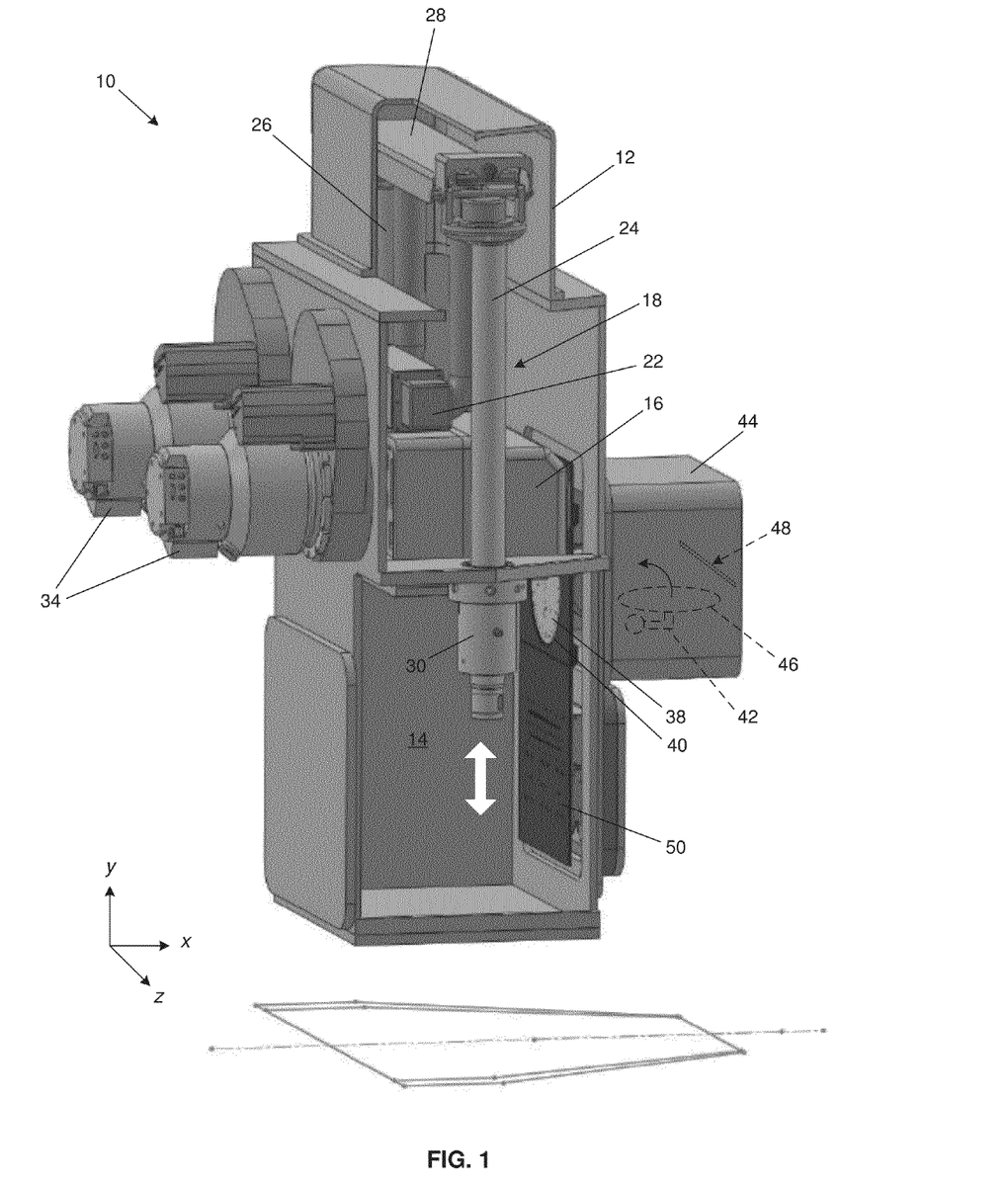
FIG. 1 is a perspective cut-away view illustrating an exemplary processing apparatus in accordance with an embodiment of the present disclosure with a plasma source of the apparatus in a fully raised position.

Referring to FIG. 1, a cut-away view of a processing apparatus, apparatus 10, consistent with a non-limiting, exemplary embodiment of the present disclosure is shown. For the sake of convenience and clarity, terms such as "front," "rear," "top," "bottom," "up," "down," "vertical," and "horizontal" will be used herein to describe the relative placement and orientation of the apparatus 10 and its various components, all with respect to the geometry and orientation of the apparatus 10 as it appears in FIG. 1. Particularly, the term "front" shall refer to right side of the apparatus 10 as it appears in FIG. 1, and the term "rear" shall refer to the left side of the apparatus 10 as it appears in FIG. 1.

The apparatus 10 may include a main housing 12 that defines a process chamber 14. A plasma source 16 may be disposed within the process chamber 14 and may be mounted on a vertically movable carriage, carriage 18 (described in greater detail below). The plasma source 16 may be oriented to transmit an ion beam horizontally toward a front of the apparatus 10. The plasma source 16 may be, for example, an RF plasma source, an inductively-coupled plasma (ICP) source, an indirectly heated cathode (IHC), or another plasma source known to those skilled in the art. In this particular embodiment, the plasma source 16 is an RF plasma source with an RF source generator (not shown) and an RF matching network 22.

Figure 2:
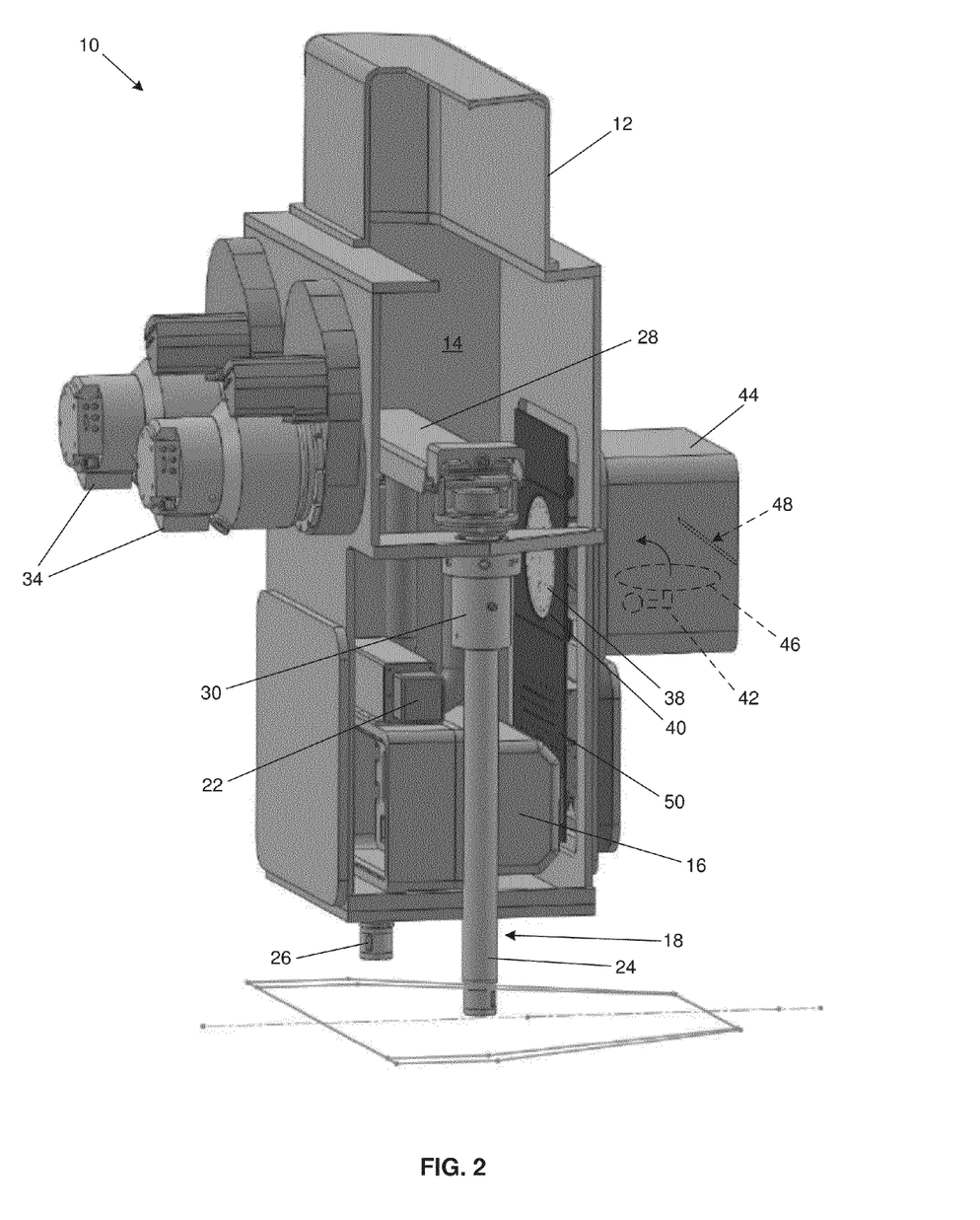
FIG. 2 is a perspective cut-away view illustrating the processing apparatus shown in FIG. 1 with the plasma source of the apparatus in a fully lowered position.

The carriage 18 may include a pair of vertically oriented, laterally spaced shafts, shown as shaft 24 and shaft 26, which are connected to opposing lateral sides of the plasma source 16. The shaft 24 and shaft 26 may be connected to one another by a laterally extending cross arm 28. The shaft 24 and shaft 26 may extend axially through respective, vertically oriented, a cylindrical air bearing, air bearing 30, and a cylindrical cylindrical air bearing, air bearing 32, that are rigidly mounted to an interior of the main housing 12 (only one of the air bearings, air bearing 30, is within view in the figures, but it will be understood that the opposing air bearing 32 is substantially identical to the air bearing 30). A linear drive mechanism (not shown) may be operatively connected to the carriage 18 and may drive or "scan" the carriage 18, as well as the plasma source 16 and RF matching network 22 supported thereby, vertically (i.e., along the y-axis in FIG. 1) between a fully raised position (as shown in FIG. 1) and a fully lowered position (as shown in FIG. 2). The linear drive mechanism may be any type of linear actuator or linear motor that is suitable for scanning the carriage 18 in a controllable manner, including, but not limited to, a hydraulic actuator, a pneumatic actuator, or an electro-mechanical actuator.

In operation, the air bearing 30 and air bearing 32 may expel pressurized air radially inwardly toward the shaft 24 and shaft 26, respectively, which extend through air bearing 30 and air bearing 32, respectively. The pressurized air may be provided, for example, via radially inwardly-facing gas outlets (not shown). The pressurized air may be supplied to the outlets by one or more high pressure air sources (not shown) coupled thereto, for example. The air bearing 30 and air bearing 32 may thereby create an air-filled gap between the air bearing 30 or air bearing 32 and its respective shaft, that is, shaft 24 or shaft 26. Thus, under normal operating conditions, the air bearing 30 and air bearing 32 may prevent or greatly mitigate horizontal movement of the shaft 24 and shaft 26, respectively, while also preventing solid-to-solid contact between the shaft 24 and air bearing 30 and preventing solid-to-solid contact between the shaft 26 and the air bearing 32. The carriage 18 may thereby be scanned vertically within the process chamber 14 without generating particulate contaminants that could otherwise be produced by engagement between the shaft 24 or shaft 26 and solid bearing surfaces.

It will be appreciated that although the carriage 18 in the illustrated embodiment is described as being used in conjunction with the air bearing 30 or air bearing 32, the use of air bearings merely one embodiment and other appropriate support and bearing arrangements can be used, as desired.

The apparatus 10 may further include a gas source (not shown) that may be connected to the plasma source 16 for providing a supply of ionizable feed gas thereto. For example, the feed gas may be delivered to the plasma source 16 via one or more conduits that may extend through the cross arm 28 and through one or both of shaft 24 and shaft 26. One or more pumps 34, such as turbomolecular pumps or cryogenic pumps, may be connected to the main housing 12 for establishing and maintaining a vacuum environment within the process chamber 14.

A substrate 38, which may be a solar cell or other device, may be arranged on a platen 40 in the process chamber 14. The platen 40 may use electrostatic clamping, mechanical clamping, or a combination of electrostatic and mechanical clamping to retain the substrate 38. The platen 40 may be configured to provide backside gas cooling to the substrate 38 in one instance. The substrate 38 may be heated or cooled to various temperatures before or during implantation using the platen 40 or some other apparatus.

Various mechanisms may be employed for controllably changing the position and/or orientation of the platen 40 in a desired manner before, during, and after an ion treatment such as an ion implantation process or ion beam etching process. For example, the apparatus 10 may include a drive mechanism 42 that is operatively coupled to the platen 40. The drive mechanism 42 may be configured to pivot the platen 40 (as indicated by the curved arrow in FIG. 1) between a vertically oriented processing position, wherein the platen 40 is disposed within the process chamber 14 in a vertical orientation as shown in FIGS. 1 and 2, and a horizontally oriented transfer position, wherein the platen 40 is disposed in a transfer chamber 44 at the front of the apparatus 10 in a horizontal orientation as indicated at 46 in FIG. 1. When the platen 40 is in the transfer position, a substrate may be loaded onto, or removed from, the platen 40 in a horizontal orientation, wherein the substrate may be transferred into or out of the transfer chamber 44 through a transfer slot 48, such as by a robotic handling apparatus (not shown). Additionally, when the platen 40 is in the processing position, the drive mechanism 42 may be configured to controllably rotate and tilt the platen 40, as well as linearly shift the platen 40 slightly forward and backward along the x-axis in FIG. 1. Such articulation of the platen 40 may be advantageous for facilitating implantation of the substrate 38 in a particular manner or configuration.

The apparatus 10 may further include a platen power supply (not shown) that may bias the platen 40 and the substrate 38 clamped thereto negatively with respect to ground, while the plasma source 16 may be grounded. Alternatively, the plasma source 16 may be biased positively with respect to ground and the platen 40 may be grounded or biased negatively with respect to ground. As detailed further below, in various embodiments, during vertical scanning of the plasma source 16 with respect to the substrate 38, changes in power of the substrate 38 and/or pulsing of bias voltage between substrate 38 and the plasma source 16 may be performed to achieve a desired dose and distribution of ions across the substrate 38. In some embodiments, the pulsing of bias voltage may be coupled with variations in plasma power setpoints to produce a desired implantation pattern in the substrate 38.

During an ion implantation process ion beam etching process, or other process, the plasma source 16 may project an ion beam 17 horizontally onto the vertically oriented surface of the substrate 38. The ion beam 17 is shown schematically as a horizontal arrow merely to indicate an average direction of propagation of the ion beam 17, but not actual dimensions, exact position, or shape. The ions in the ion beam 17 may etch a substrate in one implementation of ion beam etching or may penetrate the surface of the substrate 38 and come to rest within the substrate to form one or more regions of desired conductivity. The plasma source 16 may be scanned vertically in the manner described above (i.e., by vertically shuttling the carriage 18), thereby moving the ion beam 17 over the surface of the substrate 38 in a direction orthogonal to the horizontal path of the ion beam. The area of the substrate 38 that the ion beam 17 is scanned over during treatment by the ion beam 17 is generally referred to herein as the "scanned area" which is intended to be substantially all of the usable substrate area plus additional area (explained in greater detail below).

In some embodiments, an extraction plate (not shown) through which an ion beam 17 is directed to the substrate 38 may be provided on a side of the plasma source 16 that faces the substrate 38. The extraction plate may include an aperture, such as an elongated aperture that is elongated along the Z-axis. The size of the aperture along the Z-axis may be sufficient to extend over the entire width of a substrate 38 along the Z-direction in some examples. When a plasma (not shown) is generated in the plasma source 16, a plasma sheath boundary of the plasma may form a meniscus through which the ion beam 17 is extracted from the plasma source. The exact shape of the meniscus may be varied by altering control settings of the apparatus 10 such as plasma power, gas pressure, and so forth, as known in the art. In this manner the range of trajectories of ions that are directed to the substrate 38 may be controlled. For example, ions may be directed to the substrate 38 over a broad range of angles with respect to the X-axis, such as +/−30 degrees.

Thus, in some embodiments, ions may be emitted or directed to a substrate "along" a given direction, such as a horizontal direction, where the ions form a distribution or range of angles of incidence with respect to the horizontal direction, where the horizontal direction forms the mean angle of incidence of the distribution of angles of incidence. In other embodiments, an ion beam may be extracted from the plasma source in which the ions are parallel to one another, and in some cases also parallel to the X-axis or horizontal direction. In this case, when ions are directed "along" the horizontal direction, ions may all have the same trajectories that form a zero degree angle with respect to horizontal. Thus the term "along" as used with respect to a direction of an ion beam, refers to a mean angle of an ion beam. This applies both in cases of a parallel ion beam where ion trajectories are all along the same angle and in ion beams in which the trajectories of ions are distributed over a broad range of angles. In addition, the shape of an aperture through which ions are extracted from the plasma source 16 may have any desired shape. The embodiments are not limited in this context.

The "beam dose" refers to the quantity of ions implanted into or otherwise directed to the substrate 38 via the ion beam 17, which is dependent upon the beam current as well as the amount of time the ion beam 17 is held over particular portions of the substrate 38 as the plasma source 16 is scanned. In order to ensure that the beam dose corresponds to a desired recipe, the apparatus 10 may include an ion beam current sensor, which is referred to as the current sensor 50, which may be disposed below, and that is substantially coplanar with, the platen 40. In some examples, the current sensor 50 may be a Faraday cup having a Faraday pixel configured to measure ion beam current as an ion beam (e.g., the ion beam 17 emitted by the plasma source 16) that is incident on the Faraday pixel. Particularly, before and/or during an ion implantation process, the ion beam 17 emitted by the plasma source 16 may be scanned over the current sensor 50 (as shown in FIG. 2) in order to ensure that the dose of the ion beam 17 is consistent with a desired recipe. The measuring of beam current thus involves vertically scanning the plasma source 16 adjacent the current sensor 50 so that the ion beam 17 is intercepted by the current sensor 50. Once the beam dose is confirmed thusly, the plasma source 16 and ion beam 17 may be scanned over the substrate 38 (as shown in FIG. 1) to initiate or continue implantation thereof. In various embodiments, the apparatus 10 may be provided with a controller that is communicatively coupled to the current sensor 50 and that is configured to adjust various implantation parameters of the ion implantation process, such as, for example, the scan speed of the plasma source 16 and/or the movement of the substrate 38 via articulation of platen 40 (as described above), based on feedback from the current sensor 50.

Figure 3:
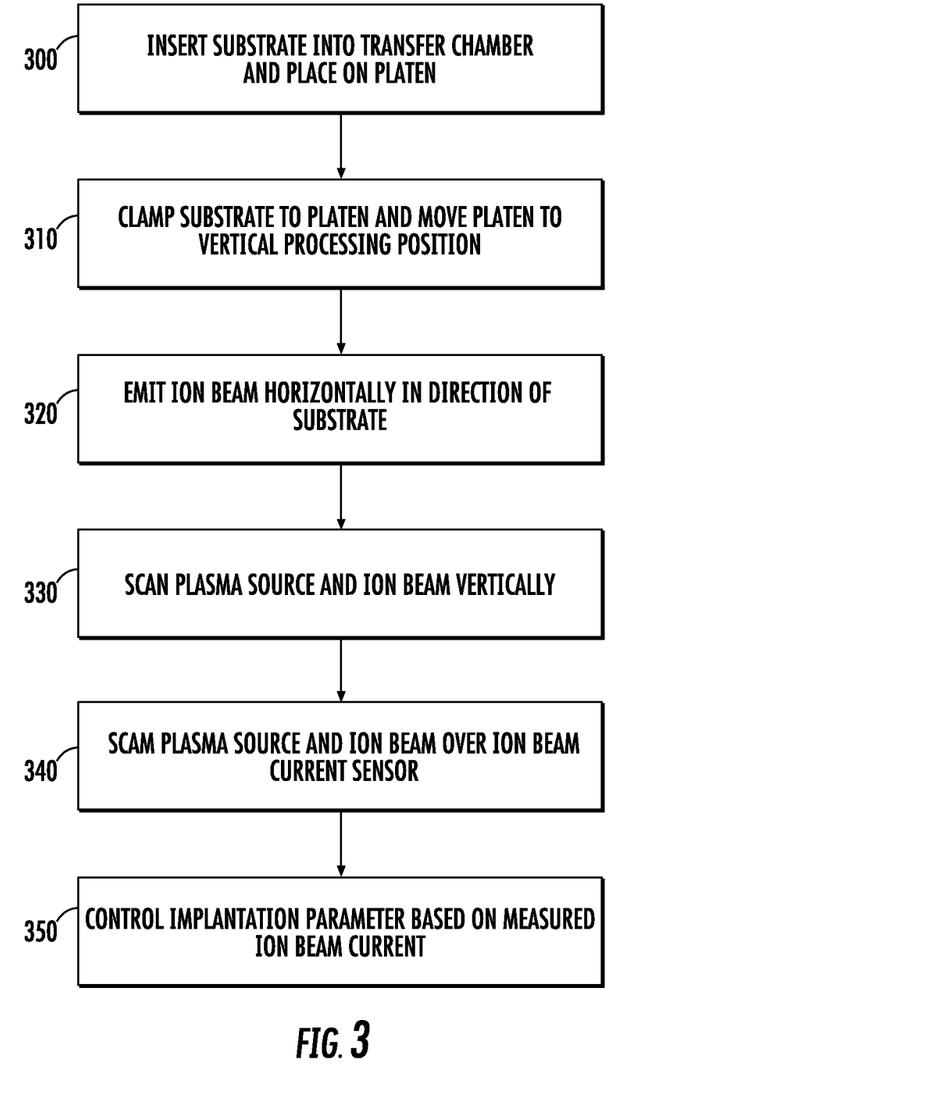
FIG. 3 is a flow diagram illustrating an exemplary processing method in accordance with an embodiment of the present disclosure.

FIG. 3 is a flow chart illustrating an exemplary method for implanting ions in a substrate, arranged in accordance with at least some embodiments of the present disclosure. In general, the method is described with reference to the apparatus 10 described above and shown in FIGS. 1 and 2.

The method may begin at block 300 where a substrate 38 may be inserted into the transfer chamber 44 via the transfer slot 48 and placed onto the platen 40 in the horizontal load position 46. The substrate 38 may then, at step 310, be clamped to the platen 40 (e.g., via electrostatic clamping) and the platen 40 and substrate 38 may be pivoted to the vertical processing position within the process chamber 14.

At step 320 of the exemplary method, the plasma source 16 may be activated and may emit an ion beam 17 horizontally toward the front of the apparatus 10 (e.g., at the substrate 38). Continuing from step 320 to step 330, the plasma source 16 and the ion beam 17 may be scanned in a first direction. For example, the plasma source 16 and ion beam 17 may be scanned vertically up and/or down along the y-axis via movement of the carriage 18. In some examples, the ion beam 17 may be scanned vertically along the y-axis at a specific frequency (e.g., 2 MHz, or the like). Continuing from step 330 to step 340, the ion beam 17 may be scanned over the current sensor 50. For example, the ion beam 17 may be scanned off of the substrate 38 and over the current sensor 50 such that the ion beam is incident upon a Faraday pixel of the current sensor 50.

At step 350 of the exemplary method, a controller may receive the measured ion beam current (from step 340) and may modify certain implantation parameters of the ion implantation process based on such measurement to achieve a desired implantation profile. For example, the controller may adjust the scan rate of the ion beam 17 by adjusting the speed with which the plasma source 16 is scanned vertically across the surface of the substrate 38 such as, for example, by increasing or decreasing the frequency of the scanning, or the like. Additionally or alternatively, the controller may increase or decrease the ion beam current. Additionally or alternatively, the controller may move (e.g., tilt or rotate) the platen 40 and substrate 38 via the drive mechanism 42.

Figure 4:
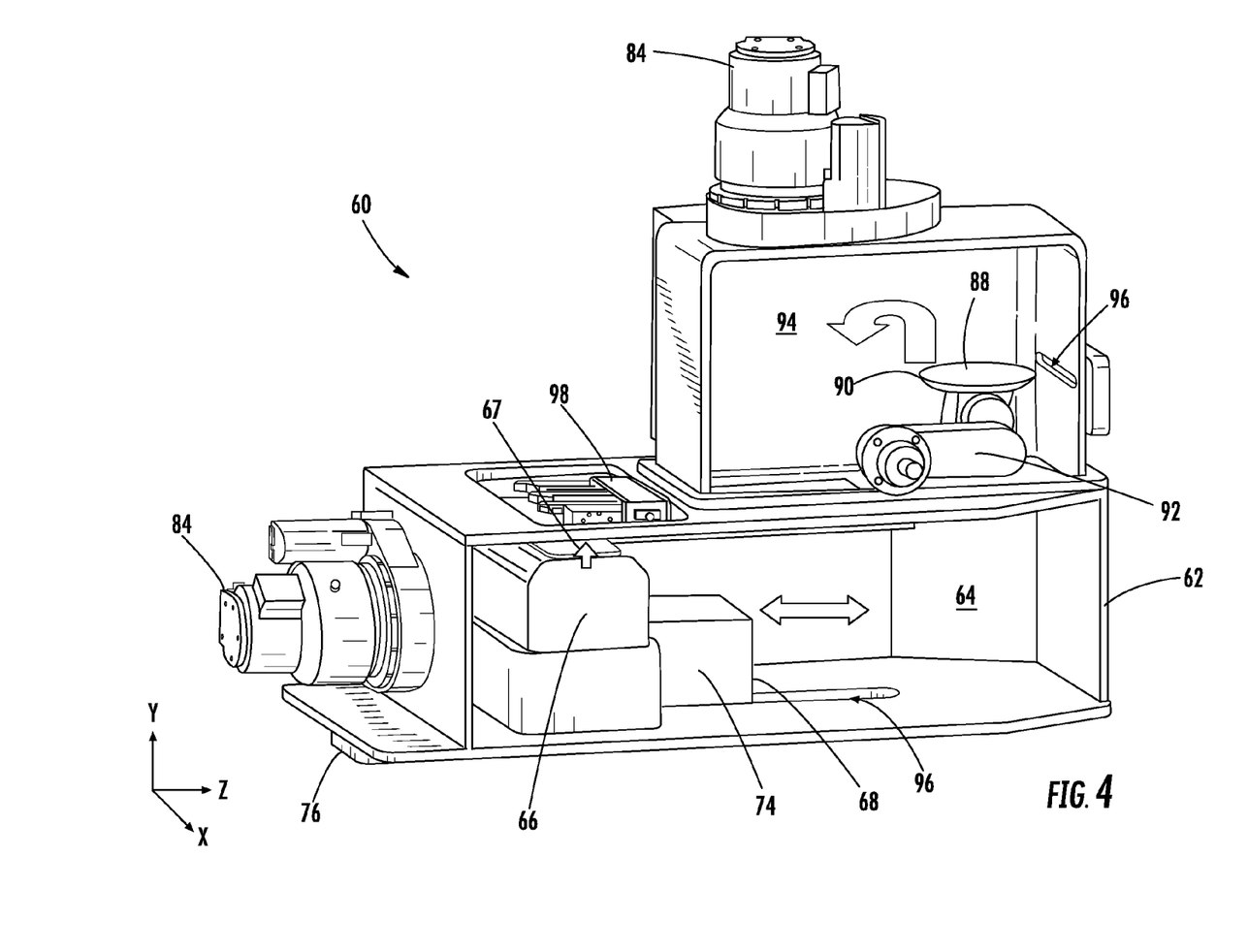
FIG. 4 is a perspective cut-away view illustrating another exemplary processing apparatus in accordance with an embodiment of the present disclosure with a plasma source of the apparatus in a fully forward position.

Referring to FIG. 4, a cut-away view of an apparatus 60 (hereinafter "the apparatus 60") consistent with another non-limiting, exemplary embodiment of the present disclosure is shown. For the sake of convenience and clarity, terms such as "front," "rear," "top," "bottom," "up," "down," "vertical," and "horizontal" will be used herein to describe the relative placement and orientation of the apparatus 60 and its various components, all with respect to the geometry and orientation of the apparatus 60 as it appears in FIG. 4. Particularly, the term "front" shall refer to right side of the apparatus 10 as it appears in FIG. 4, and the term "rear" shall refer to the left side of the apparatus as is appears in FIG. 4.

The apparatus 60 may include a main housing 62 that defines a process chamber 64. A plasma source 66 may be disposed within the process chamber 64 and may be mounted on a horizontally-movable shuttle, shuttle 68 (described in greater detail below). The plasma source 66 may be oriented to transmit an ion beam 67 vertically toward a top of the apparatus 60. The ion beam 67 is shown schematically as a vertical arrow merely to indicate an average direction of propagation of the ion beam 67, but not actual dimensions, exact position, or shape. The plasma source 66 may be, for example, an RF plasma source, an inductively-coupled plasma (ICP) source, an indirectly heated cathode (IHC), or another plasma source known to those skilled in the art. In this particular embodiment, the plasma source 66 is an RF plasma source with an RF source generator (not shown) and an RF matching network (not shown).

Figure 5:
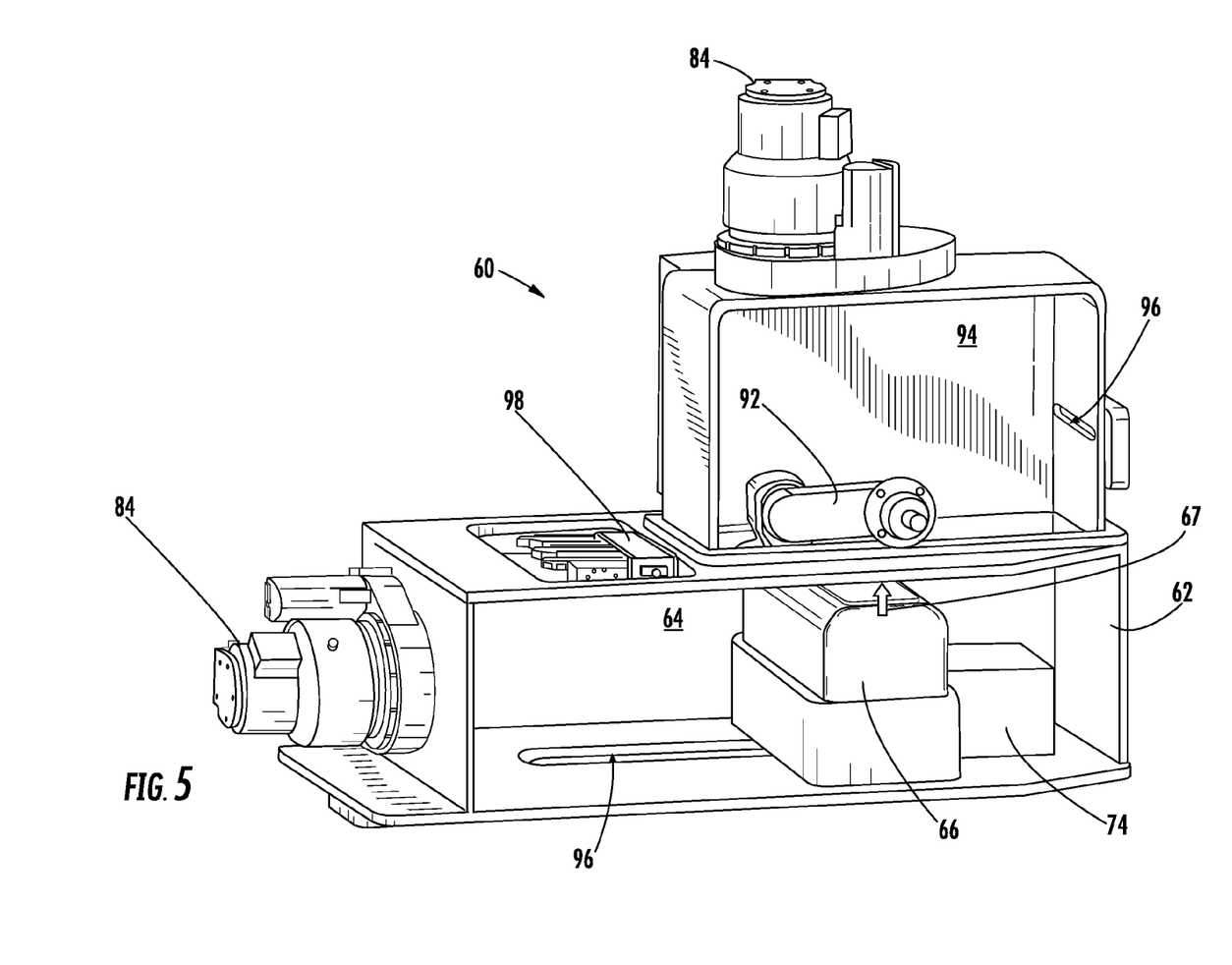
FIG. 5 is a perspective cut-away view illustrating the processing apparatus shown in FIG. 4 with the plasma source of the apparatus in a fully rearward position.

The shuttle 68 may include a sled 74 within the process chamber 64 that is connected to a front of the plasma source 66 and that is connected to a base plate 76 below the process chamber 64 via a slot 78 in the floor 80 of the main housing 62. The sled 74 and the base plate 76 may be horizontally moveable along the slot 78 while maintaining an air tight seal therebetween. A linear drive mechanism (not shown) may be operatively connected to the sled 74 and/or the base plate 76 and my drive or "scan" the sled 74, as well as the plasma source 66 connected thereto, horizontally (i.e., along the x-axis in FIG. 4) between a fully rearward position (as shown in FIG. 4) and a fully forward position (as shown in FIG. 5). The linear drive mechanism may be any type of linear actuator or linear motor that is suitable for scanning the sled 74 in a controlled manner, including, but not limited to, a hydraulic actuator, a pneumatic actuator, or an electro-mechanical actuator.

The apparatus 60 may further include a gas source (not shown) that may be connected to the plasma source 66 for providing a supply of ionizable feed gas thereto. For example, the feed gas may be delivered to the plasma source 66 via one or more conduits that may extend through sled 74. One or more pumps 84, such as turbomolecular pumps or cryogenic pumps, may be connected to the main housing 62 for establishing and maintaining a vacuum environment within the process chamber 64 and the transfer chamber 94 (described below).

A substrate 88, which may be a solar cell or other device, may be arranged on a platen 90 in the process chamber 64. The platen 90 may use electrostatic clamping, mechanical clamping, or a combination of electrostatic and mechanical clamping to retain the substrate 88. The platen 90 may be configured to provide backside gas cooling to the substrate 88 in one instance. The substrate 88 may be heated or cooled to various temperatures before or during implantation using the platen 90 or some other apparatus.

Various mechanisms may be employed for controllably changing the position and/or orientation of the platen 90 in a desired manner before, during, and after an ion implantation process. For example, the apparatus 60 may include a drive mechanism 92 that is operatively coupled to the platen 90. The drive mechanism 92 may be configured to pivot the platen 90 (as indicated by the curved arrow in FIG. 4) between a horizontally oriented processing position, wherein the platen 40 is disposed within the process chamber 64 in a downward-facing, horizontal orientation as shown in FIG. 5, and a transfer position, wherein the platen 90 is disposed in a transfer chamber 94 above the process chamber 64 in an upwardly-facing, horizontal orientation as shown in FIG. 4. When the platen 90 is in the transfer position, a substrate may be loaded onto, or removed from, the platen 90 in a horizontal orientation, wherein the substrate may be transferred into or out of the transfer chamber 94 through a transfer slot 96, such as by a robotic handling apparatus (not shown). Additionally, when the platen 90 is in the processing position, the drive mechanism 92 may be configured to controllably rotate and tilt the platen 90, as well as linearly shift the platen 90 slightly up and down along the y-axis in FIG. 5. Such articulation of the platen 90 may be advantageous for facilitating implantation or etching of the substrate 88 in a particular manner or configuration.

The apparatus 60 may further include a platen power supply (not shown) that may bias the platen 90 and the substrate 88 clamped thereto negatively with respect to ground, while the plasma source 66 may be grounded. Alternatively, the plasma source 66 may be biased positively with respect to ground and the platen 90 may be grounded or biased negatively with respect to ground. As detailed further below, in various embodiments, during horizontal scanning of the plasma source 66 with respect to the substrate 88, changes in power of the substrate 88 and/or pulsing of bias voltage between substrate 88 and the plasma source 66 may be performed to achieve a desired dose and distribution of ions across the substrate 88. In some embodiments, the pulsing of bias voltage may be coupled with variations in plasma power setpoints to produce a desired implantation pattern in the substrate 88.

During an ion implantation or etching process, the plasma source 66 may project an ion beam 67 vertically onto the horizontally oriented surface of the substrate 88. The ions in the ion beam 67 may penetrate the surface of the substrate 88 and come to rest within the substrate to form one or more regions of desired conductivity. The plasma source 66 may be scanned horizontally in the manner described above (i.e., by horizontally shuttling the sled 74), thereby moving the ion beam 67 over the surface of the substrate 88 in a direction orthogonal to the vertical path of the ion beam 67. The area of the substrate 88 that the ion beam 67 is scanned over during treatment by the ion beam 67 is generally referred to as the "scanned area" which is intended to be substantially all of the usable substrate area plus additional area (explained in greater detail below).

The "beam dose" refers to the quantity of ions implanted into or otherwise directed to the substrate 88 via the ion beam 67, which is dependent upon the beam current as well as the amount of time the ion beam 67 is held over particular portions of the substrate 88 as the plasma source 66 is scanned. In order to ensure that the beam dose corresponds to a desired recipe, the apparatus 60 may include an ion beam current sensor (hereinafter "the current sensor 98") that may be disposed below, and that is substantially coplanar with, the platen 40. In some examples, the current sensor 98 may be a Faraday cup having a Faraday pixel configured to measure ion beam current as an ion beam (e.g., the ion beam 67 emitted by the plasma source 66) that is incident on the Faraday pixel. Particularly, before and/or during an ion implantation process, the ion beam 67 emitted by the plasma source 66 may be scanned over the current sensor 98 (as shown in FIG. 4) in order to ensure that the dose of the ion beam 67 is consistent with a desired recipe. The measuring of beam current thus involves horizontally scanning the plasma source 66 adjacent the current sensor 98 so that the ion beam 67 is intercepted by the current sensor 98. Once the beam dose is confirmed thusly, the plasma source 66 and ion beam 67 may be scanned over the substrate 88 (as shown in FIG. 5) to initiate or continue implantation thereof. In various embodiments, the apparatus 60 may be provided with a controller that is communicatively coupled to the current sensor 98 and that is configured to adjust various implantation parameters of the ion implantation process, such as, for example, the scan speed of the plasma source 66 and/or the movement of the substrate 88 via articulation of platen 90 (as described above), based on feedback from the current sensor 98.

As with the embodiments of a vertically scanned plasma source, in additional embodiments, an extraction plate (not shown) through which an ion beam is directed to the substrate 38 may be provided on a side of the plasma source 86 that faces the substrate 88. In these additional embodiments, ions may be directed to the substrate 88 over a broad range of angles with respect to the Y-axis, such as +/-30 degrees. Thus, in some embodiments, ions may be emitted or directed to a substrate "along" a given direction, such as a vertical direction where the ions form a distribution of range of angles with respect to the vertical direction, where the vertical direction forms the mean angle of incidence of the distribution of angles of incidence.

Figure 6:
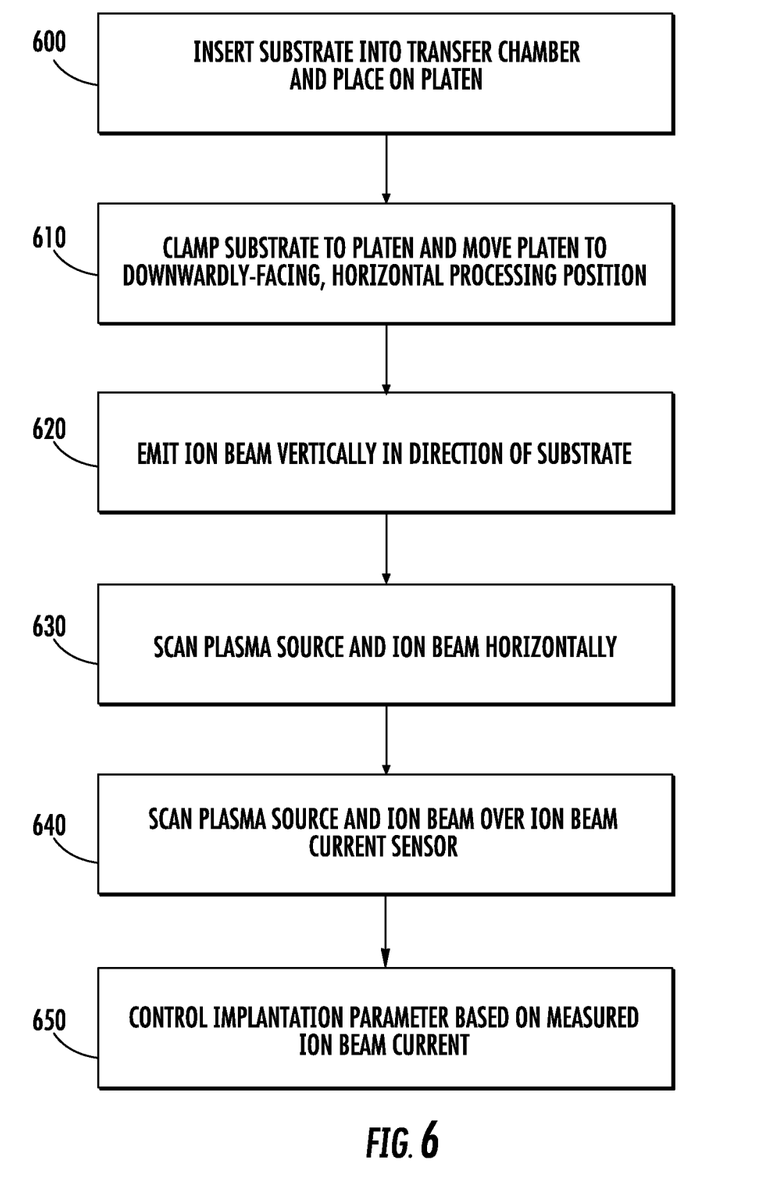
FIG. 6 is a flow diagram illustrating another exemplary processing method in accordance with an embodiment of the present disclosure.

FIG. 6 is a flow chart illustrating an exemplary method for implanting ions in a substrate, arranged in accordance with at least some embodiments of the present disclosure. In general, the method is described with reference to the apparatus 60 described above and shown in FIGS. 4 and 5.

The method may begin at block 600 where a substrate 88 may be inserted into the transfer chamber 94 via the transfer slot 96 and placed onto the platen 90 in the upwardly-facing, horizontal load position. The substrate 88 may then, at step 610, be clamped to the platen 90 (e.g., via electrostatic clamping) and the platen 90 and substrate 88 may be pivoted to the downwardly-facing, horizontal processing position within the process chamber 64.

At step 620 of the exemplary method, the plasma source 66 may be activated and may emit an ion beam 67 vertically toward the top of the apparatus 60 (e.g., at the substrate 88). Continuing from step 620 to step 630, the plasma source 66 and the ion beam 67 may be scanned in a first direction. For example, the plasma source 66 and ion beam 67 may be scanned horizontally forward and/or backward along the x-axis via movement of the sled 74. In some examples, the ion beam 67 may be scanned horizontally along the x-axis at a specific frequency (e.g., 2 MHz, or the like). Continuing from step 630 to step 640, the ion beam 67 may be scanned over the current sensor 98. For example, the ion beam 67 may be scanned off of the substrate 88 and over the current sensor 98 such that the ion beam 67 is incident upon a Faraday pixel of the current sensor 98.

At step 650 of the exemplary method, a controller may receive the measured ion beam current (from step 640) and may modify certain implantation parameters of the ion implantation process based on such measurement to achieve a desired implantation profile. For example, the controller may adjust the scan rate of the ion beam 67 by adjusting the speed with which the plasma source 66 is scanned horizontally across the surface of the substrate 88 such as, for example, by increasing or decreasing the frequency of the scanning, or the like. Additionally or alternatively, the controller may increase or decrease the ion beam current. Additionally or alternatively, the controller may move (e.g., tilt or rotate) the platen 90 and substrate 88 via the drive mechanism 92.

The forgoing disclosure thus provides embodiments of an ion implantation apparatus and corresponding methods that facilitate implantation of a substrate by scanning a plasma source relative to a stationary platen and substrate. The apparatus may therefore be implemented in a smaller form factor relative to other ion implantation apparatuses which scan a workpiece relative to a stationary plasma source and therefore require a process chamber that is at least twice as large in one dimension as a substrate to be scanned in order to facilitate implantation of the entire substrate surface.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A processing apparatus comprising:
a process chamber;
a plasma source disposed within the process chamber and mounted on a vertically movable carriage for moving the plasma source in a first, vertical direction, the movable carriage including a first shaft and a second shaft disposed on opposite sides of the plasma source, the first shaft and the second shaft extending through a first air bearing and a second air bearing, respectively, the plasma source being movable in a first direction and configured to emit an ion beam along a second direction orthogonal to the first direction;
a platen disposed within the process chamber for supporting a substrate; and
an ion beam current sensor disposed adjacent to the platen.

2. The processing apparatus of claim 1, wherein the vertically movable carriage is connected to a linear drive mechanism.

3. The processing apparatus of claim 1, wherein the platen is connected to a drive mechanism that is configured to move the platen between a horizontally oriented transfer position and a vertically oriented processing position.

4. The processing apparatus of claim 3, wherein the ion beam current sensor is vertically oriented within the process chamber and is coplanar with the platen when the platen is in the processing position.

5. The processing apparatus of claim 1, wherein the plasma source is mounted onto a horizontally movable sled and the plasma source is configured to emit the ion beam in a vertical direction.

6. The processing apparatus of claim 5, further comprising a base plate disposed below the process chamber and connected to the horizontally movable sled through a slot in a floor of the process chamber.

7. The processing apparatus of claim 5, wherein the horizontally movable sled is connected to a linear drive mechanism.

8. The processing apparatus of claim 5, wherein the platen is connected to a drive mechanism that is configured to move the platen between an upwardly-facing, horizontally oriented transfer position and a downwardly-facing, horizontally oriented processing position.

9. The processing apparatus of claim 8, wherein the ion beam current sensor is horizontally oriented within the process chamber and is coplanar with the platen when the platen is in the processing position.

10. The processing apparatus of claim 1, wherein the platen and the substrate are negatively biased with respect to ground and wherein the plasma source is grounded.

11. A method for processing a substrate using an ion beam, comprising:
    scanning a plasma source in a first direction;
    emitting the ion beam from the plasma source toward the substrate along a second direction that is orthogonal to the first direction;
    measuring a beam current of the ion beam by vertically scanning the plasma source adjacent an ion beam current sensor; and
    controlling a processing parameter based on the measuring the beam current.

12. The method of claim 11, wherein scanning the plasma source comprises vertically moving the plasma source on a carriage within a process chamber.

13. The method of claim 11, wherein scanning the plasma source comprises horizontally moving the plasma source on a sled within a process chamber.

14. The method of claim 11, wherein measuring the beam current of the ion beam comprises horizontally scanning the plasma source adjacent an ion beam current sensor.

15. The method of claim 11, wherein controlling the processing parameter comprises adjusting a scan speed of the plasma source.

16. The method of claim 11, wherein controlling the processing parameter comprises adjusting a beam current of the ion beam.

17. The method of claim 11, wherein the emitting the ion beam along the second direction comprises emitting the ion beam wherein ions of the ion beam form a range of angles of incidence with respect to the second direction, where the second direction forms a mean angle of incidence of the range of angles of incidence.

\* \* \* \* \*